US 009685141 B2

(12) United States Patent
Song et al.

(10) Patent No.: US 9,685,141 B2
(45) Date of Patent: Jun. 20, 2017

(54) MDLL/PLL HYBRID DESIGN WITH UNIFORMLY DISTRIBUTED OUTPUT PHASES

(71) Applicant: SAMSUNG DISPLAY CO., LTD., Yongin, Gyeonggi-Do (KR)

(72) Inventors: Sanquan Song, San Jose, CA (US); Wei Xiong, Mountain View, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

(21) Appl. No.: 14/593,977

(22) Filed: Jan. 9, 2015

(65) Prior Publication Data

US 2015/0221285 A1 Aug. 6, 2015

Related U.S. Application Data

(60) Provisional application No. 61/934,641, filed on Jan. 31, 2014.

(51) Int. Cl.
*H03L 7/06* (2006.01)
*G09G 5/18* (2006.01)
(Continued)

(52) U.S. Cl.
CPC ............. *G09G 5/18* (2013.01); *G09G 3/3208* (2013.01); *G09G 3/36* (2013.01); *H03K 5/135* (2013.01);
(Continued)

(58) Field of Classification Search
CPC .................................... H03L 7/08; G09G 5/18
(Continued)

(56) References Cited

U.S. PATENT DOCUMENTS 6,208,183 B1   3/2001   Li et al.
6,788,119 B1 *  9/2004   Hyland ............... H03K 5/1565
                                                  327/153

(Continued)

FOREIGN PATENT DOCUMENTS

KR   10-2010-0089584 A   8/2010
KR   10-14596966         10/2014

OTHER PUBLICATIONS

EPO Search Report dated Oct. 26, 2015, for corresponding European Patent application 15152877.5, (12 pages).

(Continued)

*Primary Examiner* — Lincoln Donovan
*Assistant Examiner* — Metasebia Retebo
(74) *Attorney, Agent, or Firm* — Lewis Roca Rothgerber Christie LLP

(57) ABSTRACT

A circuit for generating a clock signal formed as a hybrid of a multiplying delay-locked loop (MDLL) and a phase locked loop (PLL). In one embodiment a chain of inverting delay multiplexers is connected in a ring configuration capable of operating as a ring oscillator, with a first delay multiplexer in the ring configured to substitute a feed-in clock signal for the feedback clock generated by the ring oscillator when an edge, either rising or falling, is received at the forwarded clock input. The first delay multiplexer may also be configured to interpolate between the phase of the feedback clock and the phase of the feed-in clock. The interpolation may be based on transistor channel widths and the value of a control signal, and results in behavior intermediate to that of an MDLL and that of a PLL.

21 Claims, 5 Drawing Sheets

(51) Int. Cl.
    H03L 7/081      (2006.01)
    H03L 7/099      (2006.01)
    G09G 3/3208     (2016.01)
    G09G 3/36       (2006.01)
    H03K 5/135      (2006.01)
    H03L 7/08       (2006.01)

(52) U.S. Cl.
    CPC .............. *H03L 7/08* (2013.01); *H03L 7/0812* (2013.01); *H03L 7/0995* (2013.01)

(58) Field of Classification Search
    USPC .................................................. 327/156–158
    See application file for complete search history.

(56)         References Cited

U.S. PATENT DOCUMENTS

| 2002/0051511 | A1  | 5/2002  | Kataoka     |            |
|--------------|-----|---------|-------------|------------|
| 2002/0113660 | A1  | 8/2002  | Dally et al.|            |
| 2004/0046596 | A1* | 3/2004  | Kaeriyama   | H03K 5/1534 |
|              |     |         |             | 327/165    |
| 2008/0054958 | A1* | 3/2008  | Liu         | H03L 7/0814 |
|              |     |         |             | 327/149    |
| 2009/0079477 | A1  | 3/2009  | Lee         |            |
| 2009/0237395 | A1* | 9/2009  | Lee         | G09G 3/20  |
|              |     |         |             | 345/214    |
| 2010/0033212 | A1* | 2/2010  | Mahurin     | G06F 17/505 |
|              |     |         |             | 326/104    |
| 2010/0253405 | A1  | 10/2010 | Quan et al. |            |
| 2011/0109356 | A1* | 5/2011  | Ali         | H03L 7/0816 |
|              |     |         |             | 327/158    |
| 2011/0254814 | A1  | 10/2011 | Ku          |            |
| 2014/0359385 | A1* | 12/2014 | Shah        | G01R 31/3177 |
|              |     |         |             | 714/726    |
| 2015/0171918 | A1* | 6/2015  | Shiao       | H03L 7/197 |
|              |     |         |             | 375/147    |

OTHER PUBLICATIONS

Chen, Ming-Shuan et al, *A 0.1-1.5 GHz 8-bit Inverter-Based Digital-to-Phase Converter Using Harmonic Rejection*, IEEE Journal of Solid-State Circuits, vol. 48, No. 11, Nov. 1, 2013, pp. 2681-2692, XP011531076.

Al-Ahdab, S., et al, *A 12-Bit Digital-To-Time Converter (DTC) for Time-To-Digital Converter (TDC) and Other Time Domain Signal Processing Applications*, 2010, IEEE, Nov. 15, 2010, pp. 1-4, XP031836286.

Mokhtar, Siti Musliha Ajmal Binti, et al, *Memristor Based Delay Element Using Current Starved Inverter*, RSM 2013 IEEE Regional Symposium on Micro and Nanoelectronics, IEEE, Sep. 25, 2013, pp. 81-84, XP032540429.

EPO Search Report dated Jun. 3, 2015, for corresponding European Patent application 15152877.5, (5 pages).

* cited by examiner

MDLL/PLL HYBRID DESIGN WITH UNIFORMLY DISTRIBUTED OUTPUT PHASES

CROSS-REFERENCE TO RELATED APPLICATION(S)

The present application claims priority to and the benefit of Provisional Application No. 61/934,641, filed Jan. 31, 2014, entitled "MDLL/PLL HYBRID DESIGN WITH UNIFORMLY DISTRIBUTED OUTPUT PHASES", the entire content of which is incorporated herein by reference.

FIELD

One or more aspects of embodiments according to the present invention relate to systems for transmitting digital data between circuits, and more particularly to circuits for generating a local clock from a forwarded clock in such systems.

BACKGROUND

For forming a high-frequency local clock from a lower-frequency forwarded clock, a phase-locked loop (PLL) may provide better jitter filtering than a multiplying delay-line loop (MDLL), e.g., when there is dominant un-correlated jitter between the phase of the forwarded clock and the received data. A MDLL, however, can provide better jitter tracking for data transmission systems using a forwarded clock than a PLL. In a related art MDLL, the rising edge of the forwarded clock is fed into the delay line directly, similar to a delay line loop (DLL). This has the advantage that, because a DLL is an all-pass in jitter, the MDLL can track all correlated jitter. The related art MDLL has the disadvantage, however, that the front-end selection multiplexer may have a different propagation delay than the delay elements in the delay chain that follows it, leading to non-uniform output phases at the outputs of the front-end selection multiplexer and the subsequent delay elements. This non-uniform delay can cause errors in the output phase of a phase interpolator using the output signals of the front-end selection mux and the subsequent delay elements. Moreover, in the related art MDLL, only the rising edge is fed into delay line, causing M-cycle accumulated jitter.

Thus, there is a need for a multiplying delay-line loop design that provides uniform output phases with reduced accumulated jitter.

SUMMARY

Aspects of embodiments of the present invention are directed toward a circuit for generating a clock signal formed as a hybrid of a multiplying delay-locked loop (MDLL), which may also be referred to as a multiplying delay-line loop (MDLL), and a phase locked loop (PLL). A chain of inverting delay multiplexers is connected in a ring configuration capable of operating as a ring oscillator, with a first delay multiplexer in the ring configured to substitute a feed-in clock signal for the feedback clock generated by the ring oscillator when an edge, either rising or falling, is received at the forwarded clock input. The use of both clock edges of the forwarded clock to correct the phase of the local clock may reduce the accumulated jitter by half. The first delay multiplexer may also be configured to interpolate between the phase of the feedback clock and the phase of the feed-in clock. The interpolation may be based on transistor channel widths and the value of a control signal, and results in behavior intermediate to that of an MDLL and that of a PLL.

According to an embodiment of the present invention there is provided a circuit to generate a local clock signal from a forwarded clock signal, the circuit including: a plurality of delay multiplexers connected in a ring to generate the local clock signal, and a propagation delay control circuit, to adjust a propagation delay of each of the plurality of multiplexers.

In one embodiment, a first delay multiplexer of the plurality of delay multiplexers includes a feedback clock input, a feed-in clock input, and an enable input, the first delay multiplexer being to output, according to a value received at the enable input, either: an inverse of a feedback clock signal received, at the feedback clock input, from a last multiplexer of the plurality of multiplexers or an inverse of a feed-in clock signal, received at the feed-in clock input, having a triggering edge following an edge of the forwarded clock signal by a substantially fixed delay.

In one embodiment, a second delay multiplexer of the plurality of delay multiplexers includes a feedback clock input and is configured to output the inverse of a feedback clock signal received, at the feedback clock input of the second delay multiplexer, from another multiplexer of the plurality of multiplexers.

In one embodiment, the circuit includes a pulse generator including a first pulse generator output and a second pulse generator output, the pulse generator being to generate, at the first pulse generator output, after each rising edge of the forwarded clock signal, a feed-in clock signal having a triggering edge following a rising edge of the forwarded clock signal by a substantially fixed delay.

In one embodiment, the pulse generator is to generate, at the first pulse generator output, after each rising edge of the forwarded clock signal, a feed-in clock signal having a rising edge following a rising edge of the forwarded clock signal by a substantially fixed delay.

In one embodiment, the pulse generator is to generate, at the first pulse generator output, after each falling edge of the forwarded clock signal, a feed-in clock signal having a triggering edge following a falling edge of the forwarded clock signal by a substantially fixed delay.

In one embodiment, the pulse generator is to generate, at the second pulse generator output, an enable signal, the enable signal having an enabling level during a time interval overlapping the triggering edge of the feed-in clock.

In one embodiment, the first pulse generator output is connected to the feed-in dock input, and the second pulse generator output is connected to the enable input.

In one embodiment, the propagation delay control circuit includes a phase detector to measure a phase difference between the feed-in clock and an output of a frequency divider, an input of the frequency divider being connected to the feedback clock input of the first delay multiplexer.

In one embodiment, the propagation delay control circuit further includes a charge pump connected to the phase detector, and a filter connected to the charge pump.

In one embodiment, the pulse generator includes: a first delay element; a second delay element connected to the first delay element; a first exclusive or (XOR) circuit connected to an input of the first delay element and to an output of the second delay element; and a second XOR circuit connected to an output of the first delay element and to an output of the second delay element.

In one embodiment, the circuit includes four transistors configured to implement a tri-state inverter with a data input, a differential enable input, and a data output.

In one embodiment, the circuit includes: a first complementary pair of transistors; and a second complementary pair of transistors, each complementary pair of the first complementary pair of transistors and the second complementary pair of transistors including: an n-channel metal-oxide semiconductor (NMOS) transistor; and a p-channel metal-oxide semiconductor (PMOS) transistor, gates of the first complementary pair of transistors forming the differential enable input and gates of the second complementary pair of transistors being connected together to form the data input, and a central node of the series combination forming the data output.

In one embodiment, each of the first branch and the second branch further includes a complementary pair of current control transistors.

In one embodiment, the circuit includes a third branch, the third branch including four transistors to implement a tri-state inverter with a data input, a differential enable input, and a data output.

In one embodiment, each branch of the first branch, the second branch, and the third branch further includes a complementary pair of current control transistors.

In one embodiment, each of the complementary pair of current control transistors of the first branch and each of the complementary pair of current control transistors of the second branch is a compound transistor with an adjustable effective channel width.

In one embodiment, a delay multiplexer of the plurality of delay multiplexers includes: a first inverter; a second inverter; a first switch; and a second switch, each of the first and second inverters having a controllable propagation delay, an output of the first inverter being connected to an output of the delay multiplexer through the first switch, and an output of the second inverter being connected to the output of the delay multiplexer through the second switch.

In one embodiment, the timing includes: a timing controller; a driver integrated circuit (IC); and a serial data link connecting the timing controller and the driver IC, the driver IC including a circuit to generate a local clock signal.

In one embodiment, the display is an organic light emitting diode (OLED) display or a liquid crystal display (LCD).

According to an embodiment of the present invention there is provided a display, including: a timing controller; a driver integrated circuit (IC); and a serial data link connecting the timing controller and the driver IC, the driver IC including a circuit to generate a local clock signal from a forwarded clock signal, the circuit including: a plurality of delay multiplexers connected in a ring to generate the local clock signal, and a propagation delay control circuit, to adjust a propagation delay of each of the plurality of multiplexers, wherein a first delay multiplexer of the plurality of delay multiplexers includes a feedback clock input, a feed-in clock input, and an enable input, the first delay multiplexer being to output, according to a value received at the enable input, either: an inverse of a feedback clock signal received, at the feedback clock input, from a last multiplexer of the plurality of multiplexers or an inverse of a feed-in clock signal, received at the feed-in clock input, having a triggering edge following an edge of the forwarded clock signal by a substantially fixed delay.

BRIEF DESCRIPTION OF THE DRAWINGS

Features, aspects, and embodiments are described in conjunction with the attached drawings, in which.

DETAILED DESCRIPTION

Figure 1:
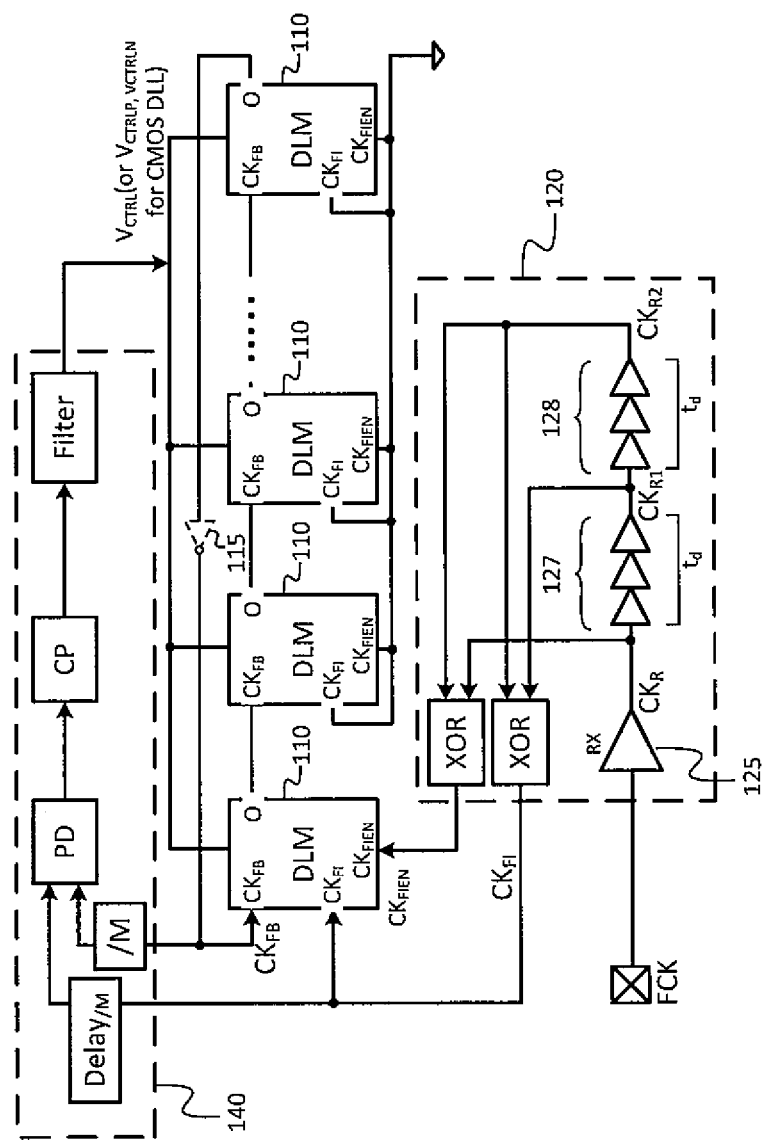
FIG. 1 is a block diagram of a multiplying delay-line loop (MDLL) phase locked loop (PLL) hybrid design according to an embodiment of the present invention.

The detailed description set forth below in connection with the appended drawings is intended as a description of exemplary embodiments of a multiplying delay-line loop/phase locked loop (MDLL/PLL) hybrid design with uniformly distributed output phases provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention.

As denoted elsewhere herein, like element numbers are intended to indicate like elements or features. Expressions such as "at least one of," when preceding a list of elements, modify the entire list of elements and do not modify the individual elements of the list. It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

Referring to FIG. 1, in one embodiment a multiplying delay-line loop (MDLL) circuit includes a chain of inverting multiplexers 110 with adjustable propagation delay, or "delay multiplexers," connected in a ring, i.e., such that the output of each delay multiplexer 110 is connected to an input of another delay multiplexer 110. The delay multiplexers 110 are designed to be substantially similar. One of the delay multiplexers 110, referred to herein as the first delay multiplexer 110, outputs the inverse of the value at a first data input labeled "$CK_{FI}$" when its enable input, labeled "$CK_{FIEN}$" is asserted; otherwise the delay multiplexer 110 outputs the inverse of the value at a second data input, labeled "$CK_{FB}$". The remaining delay multiplexers 110 are wired with the enable input deasserted so that each simply outputs the inverse of its second data input $CK_{FB}$. The output of the final delay multiplexer 110 is connected back to the second data input $CK_{FB}$ of the first delay multiplexer 110. An odd number of delay multiplexers 110 may be utilized, so that the chain of delay multiplexers 110 forms a ring oscillator when $CK_{FIEN}$ is not asserted, or an additional inverter 115 (shown in dotted lines in FIG. 1) may be used. If the clock signals are differential, this additional inversion may be implemented simply by cross-connecting one pair of differential clock lines between the output of a delay multiplexer and the input of the subsequent delay multiplexer. The ring oscillator produces a clock signal referred to as the feedback clock $CK_{FB}$, at a multiple M of the frequency of the forwarded clock FCK.

When an edge arrives in the forwarded clock signal FCK, a pulse generator 120 produces a pulse that is applied to the enable input of the first delay multiplexer 110. As a result, the enable input is asserted during the time of the pulse, and during this time, first delay multiplexer 110 substitutes the rising edge of a signal $CK_{FI}$ (also produced by the pulse generator 120) for one edge of the feedback clock $CK_{FB}$, providing a phase correction to the ring oscillator. $CK_{FI}$ is derived from the edge of the forwarded clock signal FCK.

When an edge, either rising or falling, occurs in the forwarded clock FCK, it is received by the pulse generator 120, which generates two pulses in response to the edge. A first pulse, referred to as the feed-in clock pulse $CK_{FI}$, is outputted at a first pulse generator output and has a length of $t_d$. A second pulse, referred to as the feed-in clock enable pulse $CK_{FIEN}$, is outputted at a second pulse generator output and has a length of 2 $t_d$. The forwarded clock, which may have been attenuated by transmission through the channel, is first buffered by buffer 125 to form a buffered forwarded clock signal $CK_R$. The two pulses are then formed by a combination of delays and exclusive or (XOR) circuits.

A first delay circuit 127 with a delay of $t_d$ receives the buffered forwarded clock signal $CK_R$ and forms a first delayed forwarded clock signal $CK_{R1}$. This signal is further delayed by a second delay circuit 128 also having a delay of $t_d$, to form a second delayed forwarded clock signal $CK_{R2}$. The first delay circuit 127 and the second delay circuit 128 may be formed as a chain of buffer, inverters, or other delay producing circuitry. The XOR of the first delayed forwarded clock signal $CK_{R1}$ and the second delayed forwarded clock signal $CK_{R2}$ then forms the feed-in clock pulse $CK_{FI}$ pulse signal. Thus, a rising edge of the feed-in clock $CK_{FI}$ follows each rising edge of the forwarded clock FCK by a substantially fixed propagation delay. Similarly, a rising edge of the feed-in clock $CK_{FI}$ follows each falling edge of the forwarded clock FCK by a substantially fixed propagation delay. The XOR of the buffered forwarded clock signal $CK_R$ and the second delayed forwarded clock signal $CK_{R2}$ forms feed-in clock enable pulse $CK_{FIEN}$. The use of both clock edges of the forwarded clock to correct the phase of the local clock may reduce the accumulated jitter by half.

Figure 2:
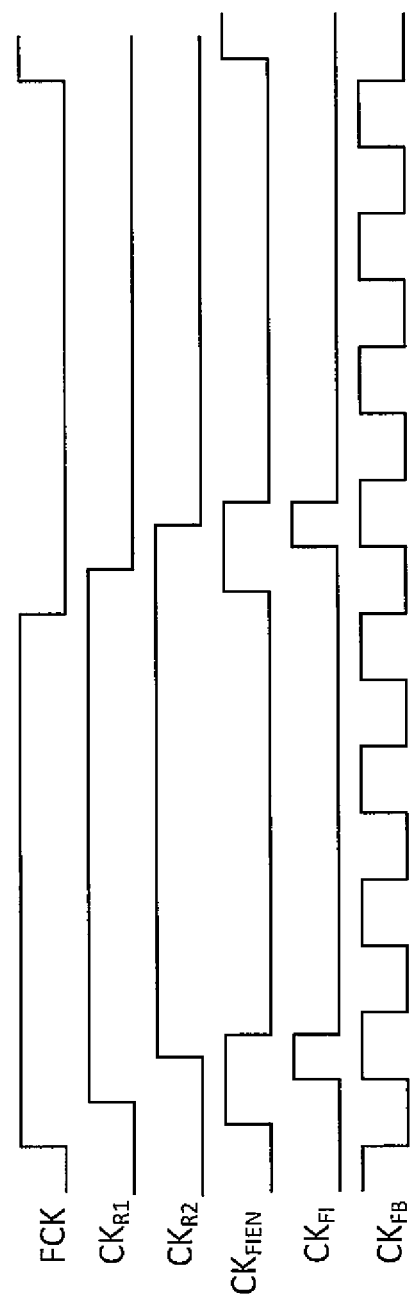
FIG. 2 is a timing diagram illustrating the operation of a pulse generator according to an embodiment of the present invention.

FIG. 2 shows a timing diagram for the pulse generator. The forwarded clock FCK is a square wave, the first delayed forwarded clock signal $CK_{R1}$ has substantially the same waveform but is delayed by $t_d$, and the second delayed forwarded clock signal $CK_{R2}$ also has substantially the same waveform and is delayed by 2 $t_d$. The feed-in clock enable pulse $CK_{FIEN}$ is a delayed (as a result of the propagation delay through the XOR circuit) signal that is high when the buffered forwarded clock signal $CK_R$ and the second delayed forwarded clock signal $CK_{R2}$ are at different logic levels. Similarly, the feed-in clock pulse $CK_{FI}$ is a delayed (as a result of the propagation delay through the XOR circuit) signal that is high when the first delayed forwarded clock signal $CK_{R1}$ and the second delayed forwarded clock signal $CK_{R2}$ are at different logic levels. Although the first and second delay circuits 127, 128 are illustrated as providing the same delay, the delays provided by these two circuits may differ in other embodiments.

Referring again to FIG. 1, the feed-in clock enable pulse $CK_{FIEN}$ is applied to the enable input of the first delay multiplexer 110, so that the subsequent rising edge of the feed-in clock pulse $CK_{FI}$ is substituted for the rising edge of the delayed forwarded clock signal when an edge arrives in the forwarded clock FCK. This rising edge of the feed-in clock pulse $CK_{FI}$ is referred to herein as the "triggering" edge of feed-in clock pulse $CK_{FI}$ because it is the edge that modifies the phase of the feedback clock.

The $CK_{FI}$ signal and the feedback clock $CK_{FB}$ are supplied to a propagation delay control circuit 140 that controls the phase of the ring oscillator. In the propagation delay control circuit 140, the feed-in clock pulse $CK_{FI}$ is compared, in a phase detector PD, to a signal formed by dividing the feedback clock $CK_{FB}$ by M; the result is fed to a charge pump CP, and filtered by a filter, to form the output $V_{CTRL}$ of the propagation delay control circuit 140. This output is connected to a delay control input on each of the delay multiplexers 110. The effect of the ring oscillator phase control circuit is to increase the propagation delay of each delay multiplexer 110, thereby decreasing the phase of the feedback clock $CK_{FB}$, when the edge of the divided feedback clock $CK_{FB}$ precedes the edge of the feed-in clock pulse $CK_{FI}$, and to decrease the propagation delay of each delay multiplexer 110, thereby increasing the phase of the feedback clock $CK_{FB}$, when the edge of the feed-in clock pulse $CK_{FI}$ precedes the edge of the divided feedback clock $CK_{FB}$. The charge pump CP may produce a current proportional to a phase difference measured by the phase detector PD, and the filter may provide a loop-shaping function for the control loop these components form around the ring oscillator. The bandwidth of the frequency control loop may be controlled by suitable selection of the gains of the phase detector, the charge pump, and the filter of the propagation delay control circuit 140.

In other embodiments the logic levels of various signals may be reversed. For example the feed-in clock pulse $CK_{FI}$ may be composed of a short pulse of logic low in a signal that is otherwise at a logic high level, and the falling edge of the feed-in clock pulse $CK_{FI}$ may be the triggering edge. In one embodiment, the delay multiplexers 110 are combined pair-wise to form non-inverting compound delay multiplexers, and the outputs of the compound delay multiplexers (i.e., the outputs consisting of the output of the every other delay multiplexer 110) are sent to the follow-on phase interpolator.

Figure 3:
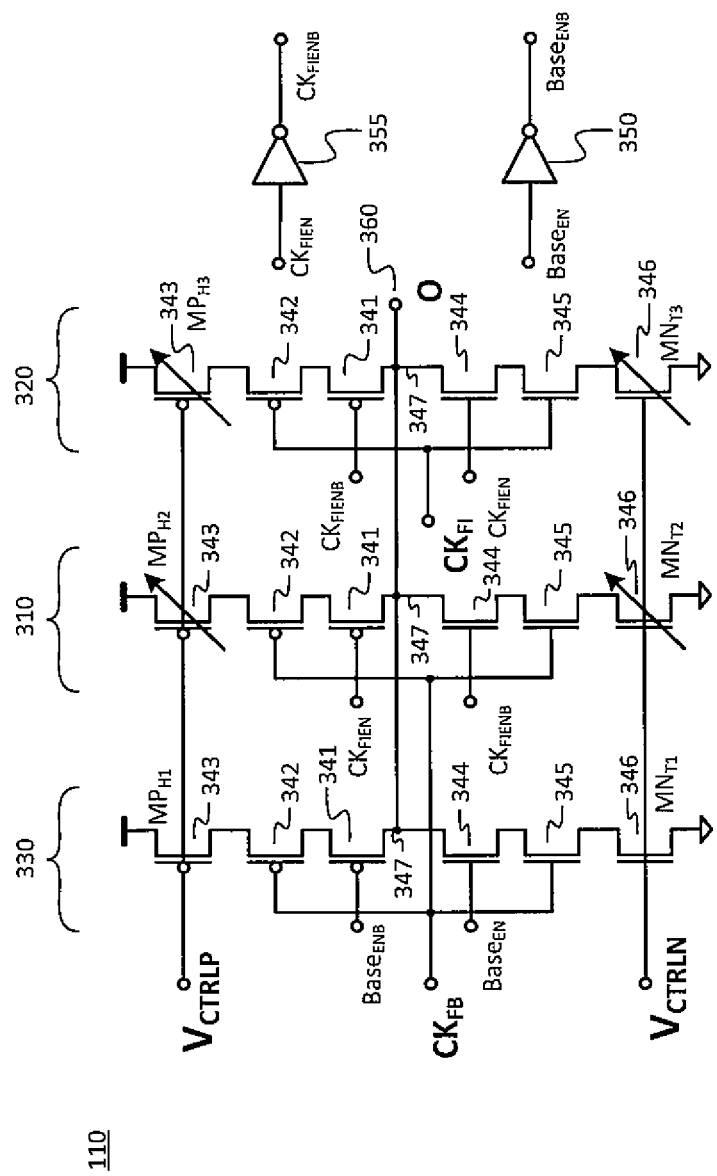
FIG. 3 is a circuit diagram of a multiplexer with adjustable propagation delay and interpolation according to an embodiment of the present invention.

Referring to FIG. 3, in one embodiment a delay multiplexer 110 includes three branches 310, 320, 330 each connected between a positive power supply voltage and ground. Each branch includes six metal oxide semiconductor field effect transistors (MOSFETs). Three p-channel MOSFETs or "PMOS" transistors are connected in series from the positive power supply voltage to the central node 347. Three series connected n-channel MOSFETs or "NMOS" transistors are connected in series from the central node to ground. The six MOSFETs in each branch form three complementary pairs: a first complementary pair including a PMOS transistor 341 and an NMOS transistor 344, a second complementary pair including a PMOS transistor 342 and an NMOS transistor 345, and third complementary pair including a PMOS transistor 343 and an NMOS transistor 346.

When both transistors of the third complementary pair of transistors in each branch of the delay multiplexer 110 are turned on, the operation of the delay multiplexer 110 may be understood as follows. Each of the three branches 310, 320, 330 acts as a tri-state inverter with a data input, an enable input, which may be a differential input, and a data output, which is the central node 347. In the third branch 330, for example, the first pair of MOSFETS 341, 344 is controlled by the differential enable signal composed of $Base_{EN}$ and its complement $Base_{ENB}$, and the second pair 342, 345 is controlled by the data signal $CK_{FB}$. If the enable is high (and its complement is low) then the output of this branch is the inverse of the data signal $CK_{FB}$. The inverter 350 is shown as forming the signal $Base_{ENB}$ from the signal $Base_{EN}$; this inverter is illustrated primarily to show the inverse relationship between $Base_{EN}$ and its complement $Base_{ENB}$, and in other embodiments these two signals may instead be generated concurrently (e.g., substantially simultaneously) as complementary outputs of another circuit.

Similarly if the enable input $CK_{FIENB}$ of the first branch 310 is high and its complement $CK_{FIEN}$ is low, the output of the first branch 310 is the inverse of its data input $CK_{FB}$. If the enable input $CK_{FIEN}$ of the second branch is high and its complement $CK_{FIENB}$ is low, the output of the second branch 320 is the inverse of its data input $CK_{FI}$. Thus the $CK_{FIEN}$ signal and its complement $CK_{FIENB}$ select whether the first branch 310 or the second branch 320 is active; when $CK_{FIEN}$ is asserted, the second branch 320 is active and the feed-in clock signal $CK_{FI}$ is substituted for the feedback clock signal $CK_{FB}$.

The first delay multiplexer 110 is utilized to select when the feed-in clock signal $CK_{FI}$ is substituted for the feedback clock signal $CK_{FB}$. The first delay multiplexer 110 may also be utilized to interpolate between the two clock signals, by asserting the first delay multiplexer's third branch enable signal $Base_{EN}$ (e.g., setting $Base_{EN}$ high and settings its complement $Base_{ENB}$ low). In this case the outputs of the second branch 320 and the third branch 330 both contribute to the output 360 of the delay multiplexer 110, if $CK_{FIEN}$ is asserted, and the outputs of the first branch 310 and the third branch 330 both contribute to the output 360 of the delay multiplexer 110 if $CK_{FIEN}$ is not asserted. In other words, when $Base_{EN}$ is deasserted, the output 360 of the first delay multiplexer carries only a current controlled by the feed-in clock signal $CK_{FI}$ when $CK_{FIEN}$ is asserted, and it carries only a current controlled by the feedback clock signal $CK_{FB}$ when $CK_{FIEN}$ is deasserted. On the other hand, when $Base_{EN}$ is asserted, the output 360 of the first delay multiplexer carries an additional current controlled, in the third branch 330, by the feedback clock signal $CK_{FB}$, regardless of whether $CK_{FIEN}$ is asserted.

Each of the delay multiplexers 110 of the circuit of FIG. 1, except the first delay multiplexer, is configured to act as an inverter of the signal received at its $CK_{FB}$ input. This is accomplished by wiring the enable inputs of the first branch 310 to enable the first branch 310 while wiring the enable inputs of the second branch 320 to disable the second branch 320, and connecting the $CK_{FI}$ input to ground.

The inverter 355 is shown as forming the signal $CK_{FIEN}$ from the signal $CK_{FIENB}$; this inverter 355 is illustrated primarily to show the inverse relationship between $CK_{FIEN}$ and its complement $CK_{FIENB}$. In other embodiments these two signals may instead be generated concurrently (e.g., substantially simultaneously) as complementary outputs of another circuit. Thus, as exemplified by the signal $CK_{FIEN}$, connections shown in FIG. 1 as a single line may represent more than one conductor, carrying, for example, a differential signal composed of a signal and its complement. The terms "input" and "output" as used herein may refer to a single conductor carrying a signal represented as a voltage with respect to ground, or a pair of conductors carrying complementary signals.

In the embodiment of FIG. 3, the first pair of MOSFETS 341, 344 is the closest to the central node 347, but the location of this pair of MOSFETS is not limited to this location, and the PMOS transistors in the upper half of any of the three branches 310, 320, 330 may be arranged in a different order, as may the NMOS transmitters in the lower half of any of the three branches 310, 320, 330.

The relative contributions of the two branches contributing when $Base_{EN}$ is asserted may be tuned at design time by selecting the channels widths of the transistors of the third pair of transistors 343, 346 in the first branch 310 and second branch 320 of the delay multiplexer 110. When the transistors of the third pair of transistors 343, 346 of the third branch 330 are significantly larger (i.e., have significantly greater channel width) than the transistors of the third pairs of transistors 343, 346 in the other two branches 310, 320 and $Base_{EN}$ is asserted, then the circuit of FIG. 1 approximates that of a phase locked loop (PLL). Conversely, if the transistors of the third pairs of transistors 343, 346 in the first and second branches 310, 320 are significantly larger than the transistors of the third branch 330, or if $Base_{EN}$ is deasserted, then the circuit of FIG. 1 approximates (or is about) that of an MDLL. In an embodiment lacking the third branch 330 entirely, the circuit of FIG. 1 is an MDLL with uniformly distributed output phases. Diagonal arrows drawn through the transistors 343, 346 of the third pair of the first branch 310 and of the second branch 320 indicate the possibility of designing the circuit with transistor channel widths selected to achieve a desired level of interpolation between the feed-in clock $CK_{FI}$ and the feedback clock $CK_{FB}$. In this manner the circuit may be adjusted to provide a compromise between the advantages of a PLL and those of a MDLL, having, for example, better jitter tracking than a PLL would exhibit when there is significant data correlated jitter with the forwarded clock, or better jitter filtering than an MDLL when there is significant data independent jitter with the forwarded clock.

The control voltages $V_{CTRLP}$ and $V_{CTRLN}$ are applied to the PMOS transistors and the NMOS transistors, respectively, of the third pair of transistors 343, 346 in each of the three branches 310, 320, 330. These transistors are configured to act as continuously variable current control transistors which control the propagation delay through the delay multiplexer 110. The lower the voltage $V_{CTRLN}$ and the higher the voltage $V_{CTRLP}$, the longer the propagation delay. $V_{CTRLN}$ and $V_{CTRLP}$ control the extent to which these transistors limit the current in the three branches and the rate at which the voltage at the output of the delay multiplexer 110 is changed, adjusting the propagation delay of the subsequent delay multiplexer 110. Thus, the inputs $V_{CTRLN}$ and $V_{CTRLP}$ may be utilized as delay control inputs to which the output of the propagation delay control circuit 140 may be connected.

In one embodiment, the transistors of the third pair of transistors 343, 346 may be compound transistors with effective channel widths that may be adjusted after fabrication, e.g., at run time. Such a compound transistor may be formed, for example, as an array of current control transistors, each connected in series with a switching transistor. Each of the series combinations is then connected in parallel. The effective channel width of the compound transistor is then the sum of the channel widths of the current control transistors in the array that are enabled (as a result of their respective switching transistors being turned on).

Figure 4:
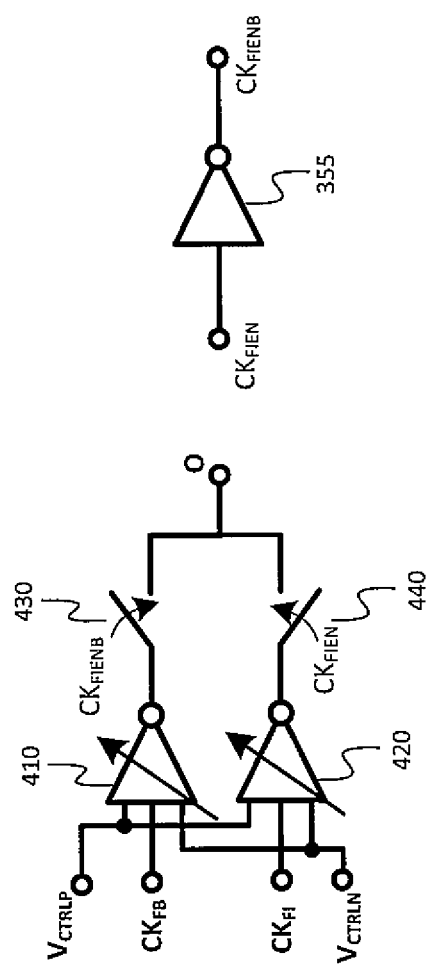
FIG. 4 is a circuit diagram of a multiplexer with adjustable propagation delay according to another embodiment of the present invention.

Referring to FIG. 4, in another embodiment a delay multiplexer 110 is implemented with two inverters 410, 420, each having a propagation delay controlled by the control voltages $V_{CTRLN}$ and $V_{CTRLP}$, the output of the delay multiplexer being selected from the outputs of the two inverters using a pair of switches 430, 440 controlled by the feed-in clock enable signal $CK_{FIEN}$ signal and its complement $CK_{FIENB}$. The inverter 355 is shown as forming the signal $CK_{FIEN}$ from the signal $CK_{FIENB}$; this inverter is illustrated primarily to show the inverse relationship between $CK_{FIEN}$ and its complement $CK_{FIENB}$, and in other embodiments these two signals may instead be generated concurrently (e.g., substantially simultaneously) as complementary outputs of another circuit.

Figure 5:
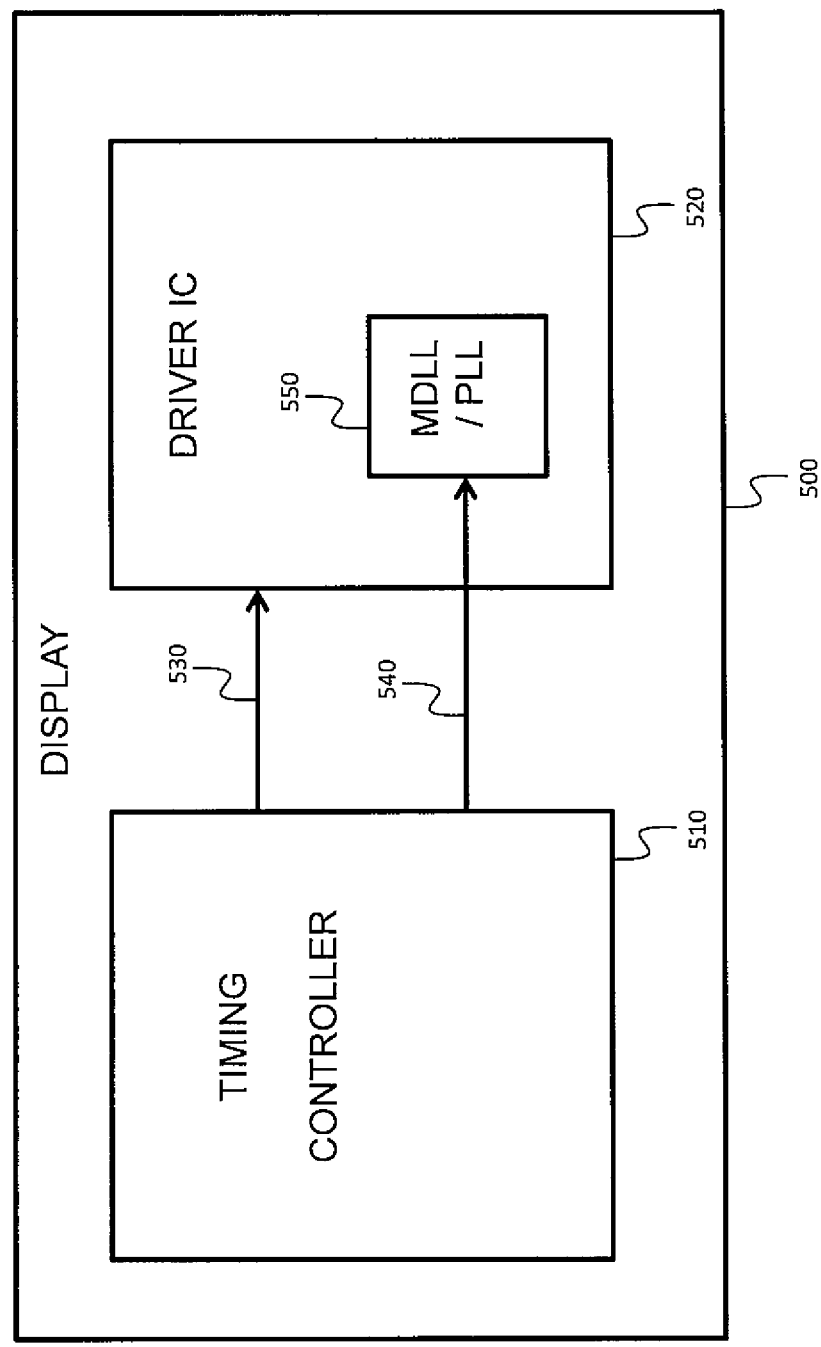
FIG. 5 is a display with an internal high-speed serial connection and a multiplying delay-line loop/phase locked loop (MDLL/PLL) hybrid design according to an embodiment of the present invention.

Referring to FIG. 5, in one embodiment a display 500 includes a timing controller 510 and a driver integrated circuit (IC) 520, and the timing controller 510 is configured to send high-speed serial data on a data lane 530, with an accompanying forwarded clock on a clock lane 540, to the driver IC 520. The forwarded clock is a reduced-frequency clock, and the driver IC generates an internal high-speed clock using a MDLL/PLL circuit 550 constructed according to an embodiment of the present invention. Here, in embodiments of the present invention, the display is an organic light emitting diode (OLED) display or a liquid crystal display (LCD).

Although limited embodiments of a MDLL/PLL hybrid design with uniformly distributed output phases have been specifically described and illustrated herein, many modifications and variations will be apparent to those skilled in the art. Accordingly, it is to be understood that an MDLL/PLL hybrid design with uniformly distributed output phases employed according to principles of this invention may be embodied other than as specifically described herein. The invention is also defined in the following claims, and equivalents thereof.

What is claimed is:

1. A circuit to generate a local clock signal from a forwarded clock signal, the circuit comprising:
   a plurality of delay multiplexers connected in a ring to generate the local clock signal, and
   a propagation delay control circuit, to adjust a propagation delay of each of the plurality of multiplexers,
   each of the plurality of delay multiplexers being an inverting multiplexer having an adjustable propagation delay,
   wherein a delay multiplexer of the plurality of delay multiplexers comprises a first branch and a second branch, each of the first and second branches comprising four transistors configured to implement a tri-state inverter with a data input, a differential enable input, and a data output, and
   wherein each of the first branch and the second branch further comprises a complementary pair of current control transistors.

2. The circuit of claim 1, wherein a first delay multiplexer of the plurality of delay multiplexers comprises a feedback clock input, a feed-in clock input, and an enable input, the first delay multiplexer being to output, according to a value received at the enable input, either:
   an inverse of a feedback clock signal received, at the feedback clock input, from a last multiplexer of the plurality of multiplexers or
   an inverse of a feed-in clock signal, received at the feed-in clock input, having a triggering edge following an edge of the forwarded clock signal by a substantially fixed delay.

3. The circuit of claim 2, wherein a second delay multiplexer of the plurality of delay multiplexers comprises a feedback clock input and is configured to output the inverse of a feedback clock signal received, at the feedback clock input of the second delay multiplexer, from another multiplexer of the plurality of multiplexers.

4. The circuit of claim 3, further comprising a pulse generator comprising a first pulse generator output and a second pulse generator output, the pulse generator being to generate, at the first pulse generator output, after each rising edge of the forwarded clock signal, a feed-in clock signal having a triggering edge following a rising edge of the forwarded clock signal by a substantially fixed delay.

5. The circuit of claim 4, wherein the pulse generator is to generate, at the first pulse generator output, after each rising edge of the forwarded clock signal, a feed-in clock signal having a rising edge following a rising edge of the forwarded clock signal by a substantially fixed delay.

6. The circuit of claim 4, wherein the pulse generator is to generate, at the first pulse generator output, after each falling edge of the forwarded clock signal, a feed-in clock signal having a triggering edge following a falling edge of the forwarded clock signal by a substantially fixed delay.

7. The circuit of claim 4, wherein the pulse generator is to generate, at the second pulse generator output, an enable signal, the enable signal having an enabling level during a time interval overlapping the triggering edge of the feed-in clock.

8. The circuit of claim 7, wherein the first pulse generator output is connected to the feed-in clock input, and the second pulse generator output is connected to the enable input.

9. The circuit of claim 8, wherein the propagation delay control circuit comprises a phase detector to measure a phase difference between the feed-in clock and an output of a frequency divider, an input of the frequency divider being connected to the feedback clock input of the first delay multiplexer.

10. The circuit of claim 9, wherein the propagation delay control circuit further comprises a charge pump connected to the phase detector, and a filter connected to the charge pump.

11. The circuit of claim 4, wherein the pulse generator comprises:
   a first delay element;
   a second delay element connected to the first delay element;
   a first exclusive or (XOR) circuit connected to an input of the first delay element and to an output of the second delay element; and
   a second XOR circuit connected to an output of the first delay element and to an output of the second delay element.

12. The circuit of claim 1, wherein each of the first branch and the second branch comprises a series combination of four transistors comprising:
   a first complementary pair of transistors; and
   a second complementary pair of transistors,
   each complementary pair of the first complementary pair of transistors and the second complementary pair of transistors comprising:
   an n-channel metal-oxide semiconductor (NMOS) transistor; and
   a p-channel metal-oxide semiconductor (PMOS) transistor,
   gates of the first complementary pair of transistors forming the differential enable input and gates of the second complementary pair of transistors being connected together to form the data input, and a central node of the series combination forming the data output.

13. The circuit of claim 1, further comprising a third branch, the third branch comprising four transistors to implement a tri-state inverter with a data input, a differential enable input, and a data output.

14. The circuit of claim 13, wherein each branch of the first branch, the second branch, and the third branch further comprises a complementary pair of current control transistors.

15. The circuit of claim 14, wherein each of the complementary pair of current control transistors of the first branch and each of the complementary pair of current control transistors of the second branch is a compound transistor with an adjustable effective channel width.

16. The circuit of claim 15, wherein each compound transistor of the first branch and the second branch comprises an array of current control transistors, each connected in series with a switching transistor.

17. The circuit of claim 16, wherein the circuit is configured to:
   operate approximately as a phase locked loop when the current control transistors of the first branch are adjusted for a first effective channel width, and
   operate approximately as a multiplying delay-line loop when the current control transistors of the first branch are adjusted for a second effective channel width, greater than the first effective channel width.

18. The circuit of claim 1, wherein a delay multiplexer of the plurality of delay multiplexers comprises:
   a first inverter;
   a second inverter;
   a first switch; and
   a second switch,
   each of the first and second inverters having a controllable propagation delay,
   an output of the first inverter being connected to an output of the delay multiplexer through the first switch, and
   an output of the second inverter being connected to the output of the delay multiplexer through the second switch.

19. A display, comprising:
   a timing controller;
   a driver integrated circuit (IC); and
   a serial data link connecting the timing controller and the driver IC,
   the driver IC comprising the circuit of claim 1.

20. The display of claim 19, wherein the display is an organic light emitting diode (OLED) display or a liquid crystal display (LCD).

21. A display, comprising:
   a timing controller;
   a driver integrated circuit (IC); and
   a serial data link connecting the timing controller and the driver IC,
   the driver IC comprising a circuit to generate a local clock signal from a forwarded clock signal, the circuit comprising:
      a plurality of delay multiplexers connected in a ring to generate the local clock signal, each of the plurality of delay multiplexers being an inverting multiplexer having an adjustable propagation delay; and
      a propagation delay control circuit, to adjust the adjustable propagation delay of each of the plurality of multiplexers,
   wherein a first delay multiplexer of the plurality of delay multiplexers comprises a feedback clock input, a feed-in clock input, and an enable input, the first delay multiplexer being to output, according to a value received at the enable input, either:
   an inverse of a feedback clock signal received, at the feedback clock input, from a last multiplexer of the plurality of multiplexers or
   an inverse of a feed-in clock signal, received at the feed-in clock input, having a triggering edge following an edge of the forwarded clock signal by a substantially fixed delay,
   wherein a delay multiplexer of the plurality of delay multiplexers comprises a first branch and a second branch, each of the first and second branches comprising four transistors configured to implement a tri-state inverter with a data input, a differential enable input, and a data output, and
   wherein each of the first branch and the second branch further comprises a complementary pair of current control transistors.

* * * * *